(12) United States Patent
Cohen et al.

(10) Patent No.: US 11,004,511 B2
(45) Date of Patent: May 11, 2021

(54) MEMORY DEVICE HAVING SEPARATE PROGRAMMING AND RESISTANCE READOUT CONTROL

(71) Applicant: INTERNATIONAL BUSINESS MACHINES CORPORATION, Armonk, NY (US)

(72) Inventors: Guy M. Cohen, Ossining, NY (US); Takashi Ando, Tuckahoe, NY (US); Nanbo Gong, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/529,021

(22) Filed: Aug. 1, 2019

(65) Prior Publication Data
US 2021/0035639 A1 Feb. 4, 2021

(51) Int. Cl.
*G11C 13/00* (2006.01)
*H01L 45/00* (2006.01)

(52) U.S. Cl.
CPC ........ *G11C 13/0069* (2013.01); *G11C 13/004* (2013.01); *H01L 45/06* (2013.01); *H01L 45/1206* (2013.01); *H01L 45/1286* (2013.01); *H01L 45/1675* (2013.01); *G11C 2013/008* (2013.01); *G11C 2013/0054* (2013.01)

(58) Field of Classification Search
CPC . H01L 45/1206; H01L 45/06; H01L 45/1286; G11C 13/0069; G11C 13/004
See application file for complete search history.

(56) References Cited

U.S. PATENT DOCUMENTS

| | | | |
|---|---|---|---|
| 7,494,849 B2 | 2/2009 | Oliva et al. |
| 7,579,616 B2 | 8/2009 | Chen et al. |
| 7,880,194 B2 | 2/2011 | Breitwisch et al. |
| 7,902,536 B2 | 3/2011 | Czubatyj et al. |
| 9,257,647 B2 | 2/2016 | Borodulin et al. |
| 9,419,213 B2 | 8/2016 | Raieszadeh et al. |
| 9,647,209 B2 | 5/2017 | Goktepeli et al. |
| 10,164,608 B2 | 12/2018 | Belot et al. |
| 2017/0365427 A1 | 12/2017 | Borodulin et al. |

OTHER PUBLICATIONS

El-Hinnawy, "A Four-Terminal, Inline, Chalcogenide Phase-Change RF Switch Using Independent Resistive Heater for Thermal Actuation", IEEE Electron Device Letters, vol. 34, No. 10, Oct. 2013, pp. 1313-1315.

*Primary Examiner* — Allison Bernstein
(74) *Attorney, Agent, or Firm* — Tutunjian & Bitetto, P.C.; Randall Bluestone

(57) ABSTRACT

A method for fabricating a semiconductor device includes forming first contacts to a heater for programming, and forming second contacts to a phase-change material layer for resistance readout. The phase-change material layer is formed in proximity to the heater, and the first contacts are electrically isolated from the second contacts to provide separate programming and resistance readout control.

19 Claims, 10 Drawing Sheets

MEMORY DEVICE HAVING SEPARATE PROGRAMMING AND RESISTANCE READOUT CONTROL

BACKGROUND

The present invention generally relates to semiconductor devices, and more particularly to memory devices and methods of forming the same.

A memory cell is a component of a computer memory device that includes an electronic circuit that stores one or more bits of digital information. The memory can be a volatile memory or a non-volatile memory. A volatile memory requires power to maintain its state, while a non-volatile memory maintains its state even if the device is powered off. One example of non-volatile memory is phase-change memory (PCM). PCM can exploit semiconducting properties of phase-change materials, such as, e.g., chalcogenide glass, that include amorphous and crystalline phases. Information can be stored by setting the phase change material into one of the two phases: the amorphous phase (high resistance) or the crystalline (low resistance) phase. The switching between the two phases can be achieved by applying a current pulse. Information can be read by measuring a resistance of the PCM cell. PCM technology can be used for, e.g., electronic synapse devices, memristors for neuromorphic or analog computing, and high-density/high-speed non-volatile memory applications.

SUMMARY

In accordance with an embodiment, a method for forming a semiconductor device is provided. The method includes forming first contacts to a heater for programming, and forming second contacts to a phase-change material layer for resistance readout. The phase-change material layer is formed in proximity to the heater, and the first contacts are electrically isolated from the second contacts to provide separate programming and resistance readout control.

In accordance with another embodiment, a method for forming a semiconductor device is provided. The method includes forming a semiconductor layer on a base structure including a substrate and an insulator layer, forming a heater based on the semiconductor layer, forming a phase-change material layer in proximity to the heater, forming insulator material around the phase-change material layer, forming first contacts through the insulator material to heater contact regions of the heater for programming, and forming second contacts through the insulator material to the phase-change material layer for resistance readout. The first contacts are electrically isolated from the second contacts to provide separate programming and resistance readout control.

In accordance with yet another embodiment, a semiconductor device is provided. The device includes a heater disposed on a base structure including a substrate and a first insulator layer, a phase-change material layer located in proximity to the heater, first contacts disposed on the heater for programming, and second contacts disposed on the phase-change material layer for resistance readout. The first contacts are electrically isolated from the second contacts to provide separate programming and resistance readout control.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
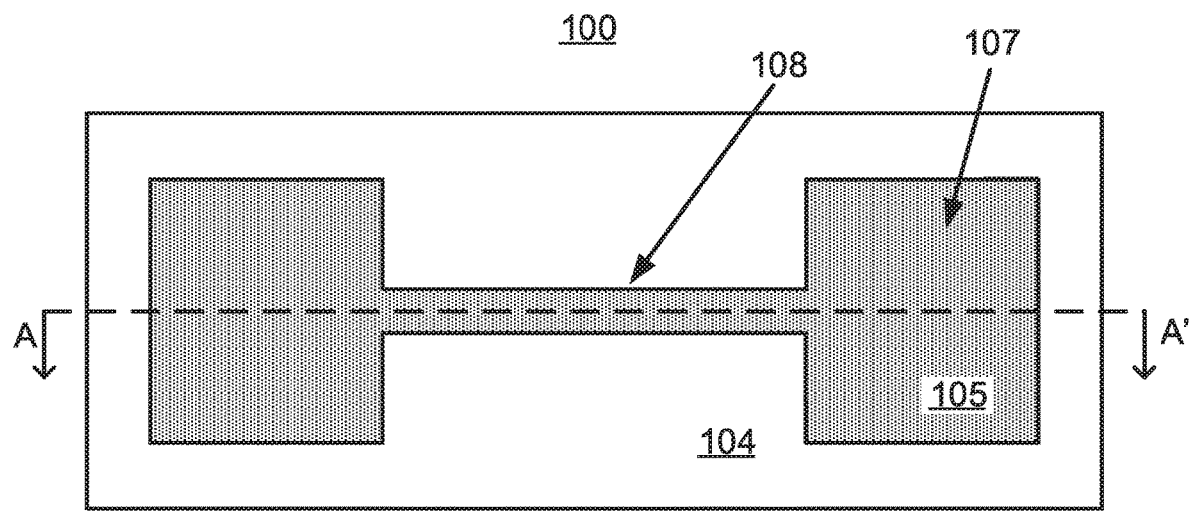
FIG. 1 is a top view showing a semiconductor device having a nanowire over an insulator layer, in accordance with an embodiment of the present invention.

The embodiments described herein provide for semiconductor devices including memory devices having separate programming and resistance readout control. Separating the programming from the readout can permit the utilization of partial sets as well as partial resets. More specifically, a memory device described herein can include a phase-change memory device including a heater placed in proximity to a phase-change material, where the heater is electrically isolated from the phase-change material. For example, the phase-change material can be wrapped around the heater. The heater functions to change the phase of the phase-change material (e.g., amorphous and crystalline). Various types of heaters are contemplated including, but not limited to, a nanowire heater, a fin heater, or a heater wrapped around a nanowire structure, etc. The heater material can be optimized separately from the PCM material choice.

The memory device described herein can include a four-terminal PCM device having two terminals or contacts for reading (measuring) the resistance of phase-change material, and two terminals electrically isolated from the terminals for reading the resistance used to program the phase (hence the resistance) of the phase-change material. Different current or voltage pulses can be applied to the first set of terminals and the second set of terminals.

Due to the lack of current flow through the phase-change material during programming, a first reset pulse can be applied and then a second reset pulse can be applied to change the extent of the amorphous material formed by the first pulse, since the reset pulses are passed through a heater (which can be always conducting) and not through the phase-change material. In contrast, in a two terminal PCM device, once a reset pulse is applied, the bottom electrode can be covered by amorphous phase-change material, and an additional reset pulse will not change the amorphous region. The four-terminal PCM device described herein can also circumvent current-related effects that can be present when programming and reading with the same terminals (e.g., electro migration, the Seebeck effect, and the Peltier effect). The embodiments described herein can provide PCM devices with increased energy efficiency, since virtually all of the generated heat can be passed through the PCM device instead of being lost to the substrate or surrounding devices.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including,"

when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 2:
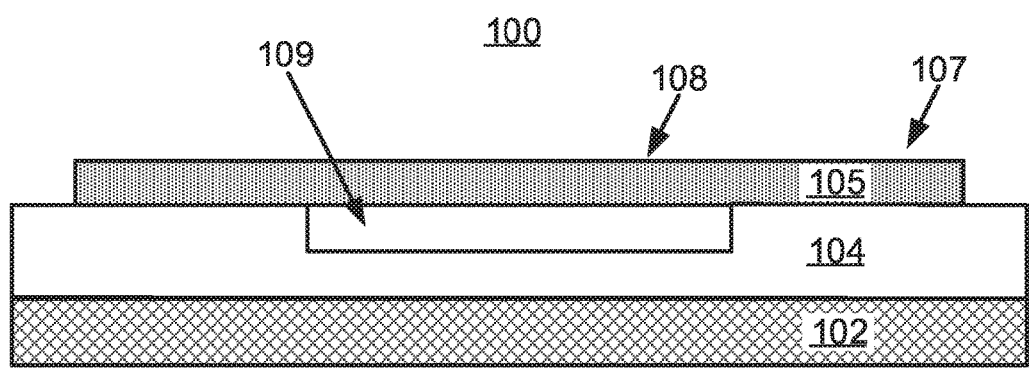
FIG. 2 is a cross-sectional view of FIG. 1, showing the nanowire over the insulator layer, in accordance with an embodiment of the present invention.

Referring now to the drawings in which like numerals represent the same or similar elements and initially to FIG. 1, a top-down view of a semiconductor device 100 is provided and, with reference to FIG. 2, a cross-sectional view of the device 100 through line A-A' of FIG. 1 is provided. In on embodiment, the device 100 includes a phase-change memory (PCM) device.

As shown, the device 100 includes a substrate 102. The substrate 102 can be a bulk-semiconductor substrate. In one example, the bulk-semiconductor substrate may be a silicon (Si)-containing material. Illustrative examples of Si-containing materials suitable for the bulk-semiconductor substrate include, but are not limited to, Si, SiGe, SiGeC, SiC, polysilicon, epitaxial silicon, amorphous Si, and multi-layers thereof. Although silicon is the predominantly used semiconductor material in wafer fabrication, alternative semiconductor materials can be employed, such as, but not limited to, germanium, gallium arsenide, gallium nitride, silicon germanium, cadmium telluride and zinc sellenide. The substrate 102 may also be a semiconductor-on-insulator (SOI) substrate.

As further shown, the device 100 can further include an insulator layer 104. The insulator layer 104 can include an oxide (e.g., silicon dioxide ($SiO_2$)), a nitride (e.g., a silicon nitride material (e.g., $Si_3N_4$)), an oxynitride (e.g., SiON), SiOC, SiOCN, SiCN, SiBCN), or any suitable combination of those materials. However, the insulator layer 104 can include any suitable material in accordance with the embodiments described herein.

The substrate 102 and the insulator layer 104 can collectively be referred to herein as "a base structure."

As further shown, the device 100 can further include a semiconductor layer 105 disposed on the insulator layer 104. In one embodiment, the semiconductor layer 105 includes Si. A nanowire 108 can be formed from the semiconductor layer 105.

The insulator layer 104 and the semiconductor layer 105 can be included as layers of an SOI substrate with the substrate 102. In another embodiment, the insulator layer 104 can be formed on the semiconductor substrate 102, and the semiconductor layer 105 can be formed on the insulator layer 104.

As further shown, the insulator layer 104 can be patterned to form a trench 109. In one embodiment, the insulator layer 104 can be patterned to form the trench 109 by etching with a diluted hydrofluoric acid (DHF). In one embodiment, the semiconductor layer 105 can be patterned to form heater contact regions 107 and nanowire (or fin) region 108. After pattering of the nanowire 108, the insulator layer 104 is patterned to form the trench 109. The silicon fin can then be suspended over the trench 109 to form the suspended nanowires 108.

Figure 3:
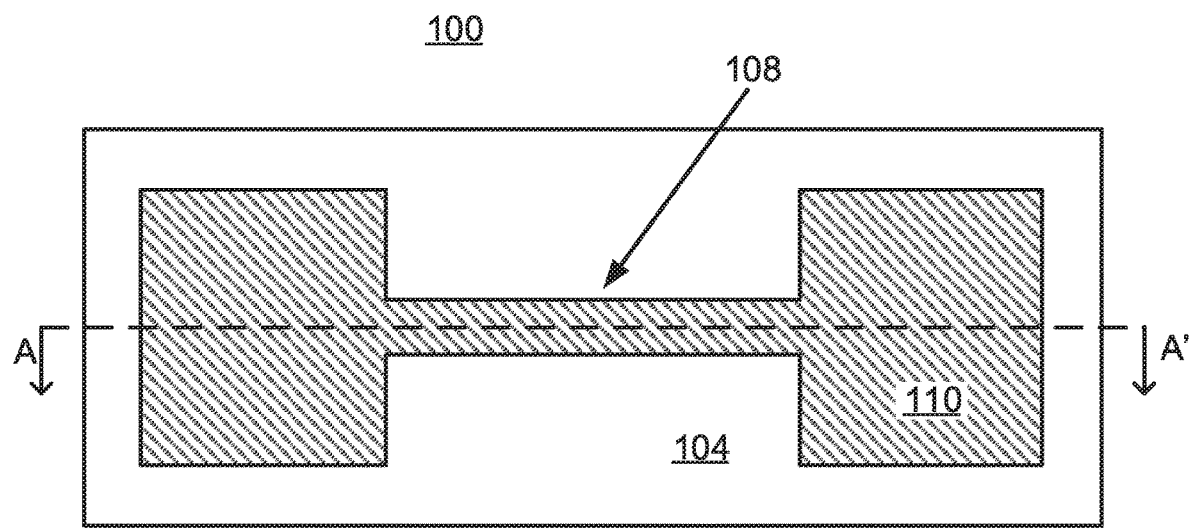
FIG. 3 is a top view showing semiconductor device of FIG. 1 with the nanowire annealed and covered with an insulator, in accordance with an embodiment of the present invention.
Figure 4:
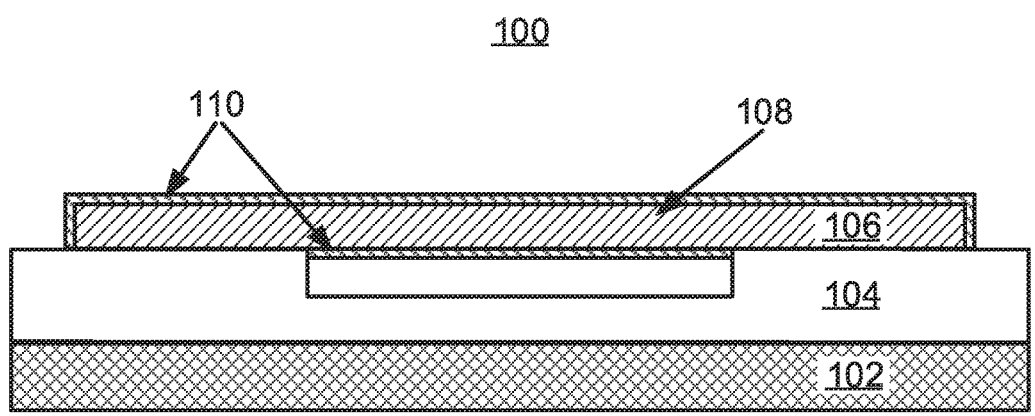
FIG. 4 is cross-sectional view of FIG. 3, showing the nanowire annealed and covered with the insulator, in accordance with an embodiment of the present invention.

With reference to FIG. 3, a top-down view of the device 100 is provided after an anneal process and, with reference to FIG. 4, a cross-sectional view of the device 100 through line A-A' of FIG. 3 is shown.

The nanowire 108 can have several cross-sectional shapes. In one embodiment, the nanowire 108 can include a rectangular cross-section. In another embodiment the nanowire 108 can be annealed in hydrogen ($H_2$) to convert the nanowire 108 from a rectangular body to a cylindrical body. Depending on the annealing temperature and/or pressure, thinning of the nanowire 108 body can be accomplished. The annealing can smooth the outer surface of the nanowire 108 and reduce line-edge roughness (LER). The semiconductor layer 105 can be annealed at a plurality of temperatures and pressures. In one embodiment, the nanowire 108 can be annealed at a temperature of between, e.g., about 550° C. to about 1050° C. More specifically, the semiconductor layer 105 can be annealed at a temperature of, e.g., about 800° C. The anneal process may be provided by at least one of a rapid thermal anneal (RTA) process, or a furnace anneal. In one embodiment, the nanowire 108 can be annealed at a $H_2$ pressure of between, e.g., about 30 torr to about 600 torr.

Following the annealing, the semiconductor layer 105 can be converted into a heater 106 by first coating the annealed semiconductor layer 105 with a conductive material (e.g., metal), and performing another annealing process. For example, the heater 106 can include a metal-silicide formed by first coating the semiconductor layer 105 with a metal such as, e.g., nickel (Ni), and then annealing the semiconductor layer 105 to form the heater 106 including a metal-silicide (e.g., NiSi$_2$). The excess metal following the annealing can be etched selectively. Alternatively, a conductive material (e.g., metal) source can be placed at the end of the nanowire 108 and then by a process of metal diffusion and reaction the semiconductor layer 105 can be converted into the heater 106. For example, when the metal is reacted from one end of a single-crystal Si nanowire 108, it is possible to convert the entire body of the nanowire 108 into a single-crystal silicide.

In an alternative embodiment, the heater 106 can be formed by coating the semiconductor layer 105 with a resistive metal that does not react with the semiconductor layer 105. For example, semiconductor layer 105 can be coated by conformally depositing a layer of, e.g., tantalum nitride (TaN) or titanium nitride (TiN), or other suitable material. The percentage of nitrogen in the metal-nitride film is chosen to obtain the desired resistivity of the conformally deposited layer. The conformal deposition can be done using any suitable process in accordance with the embodiments described herein (e.g., atomic layer deposition (ALD)).

The heater 106 can then be coated all-around, or encapsulated, with an insulator layer 110. The insulator layer 110 can include a thin dielectric layer. For example, the insulator layer 110 can include an oxide (e.g., silicon dioxide (SiO$_2$)), a nitride (e.g., a silicon nitride material (e.g., Si$_3$N$_4$)), an oxynitride (e.g., SiON), SiOC, SiOCN, SiCN, SiBCN, or any suitable combination of those materials. However, the insulator layer 110 can include any suitable material in accordance with the embodiments described herein.

Figure 5:
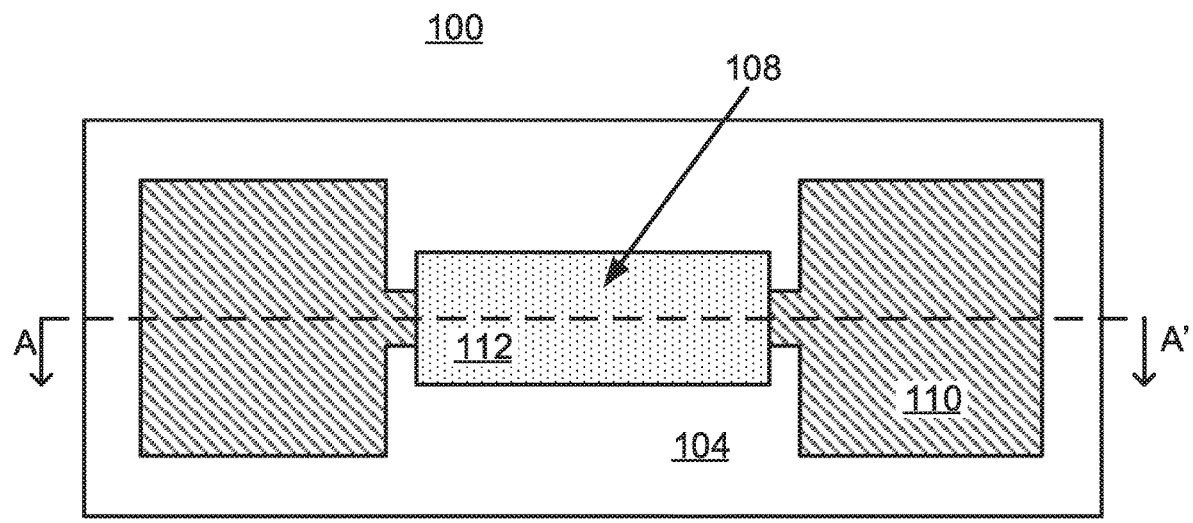
FIG. 5 is a top view showing semiconductor device of FIG. 3 with a phase changing material (PCM) formed around the nanowire, in accordance with an embodiment of the present invention.
Figure 6:
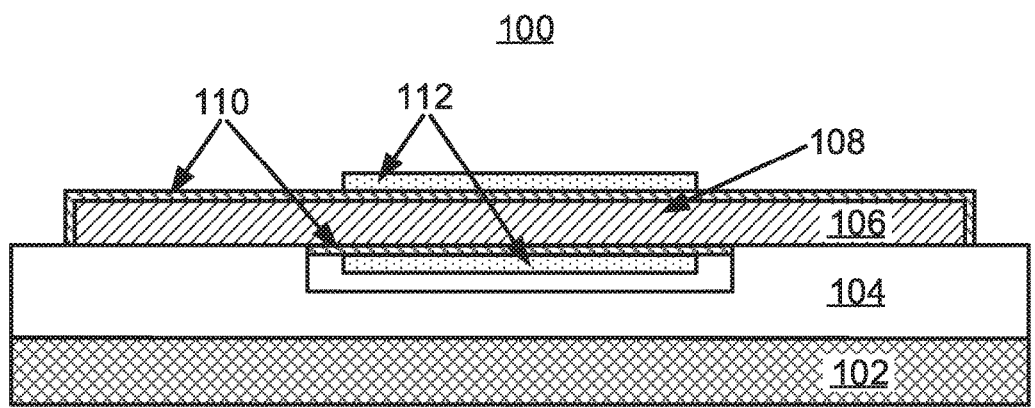
FIG. 6 is cross-sectional view of FIG. 5, showing the PCM formed around the nanowire, in accordance with an embodiment of the present invention.

With reference to FIG. 5, a top-down view of the device 100 is provided showing the formation of a phase-change material layer 112, and FIG. 6 is cross-sectional view of the device 100 through line A-A' of FIG. 5.

The phase-change material layer 112 can be formed by depositing phase-change material over the insulator layer 110, and removing the phase-change material from the heater contact regions 107. The phase-change material layer 112 can include any suitable phase-change material in accordance with the embodiments described herein. Examples of suitable phase-change materials include, but are not limited to, Ge$_2$Sb$_2$Te$_5$ (GST), Sb$_2$Te$_3$, GeTe, etc. As described in further detail herein, the reset current does not flow through the phase-change material. Accordingly, the resistivity of the chosen phase-change material need not be a concern.

Any suitable process can be used to remove the phase-change material from the regions corresponding to the heater contacts 107 in accordance with the embodiments described herein. For example, sputtering (e.g., argon (Ar) sputtering) can be used to remove GST selectively to most other materials (e.g., Si3N4, TiN and/or TaN).

Figure 7:
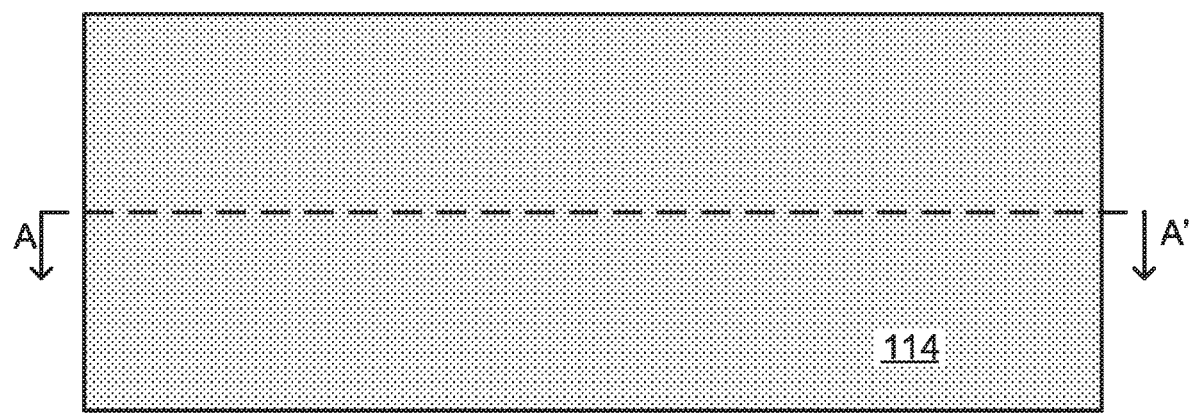
FIG. 7 is a top view showing semiconductor device of FIG. 5 with the semiconductor device covered in an insulating material, in accordance with an embodiment of the present invention.
Figure 8:
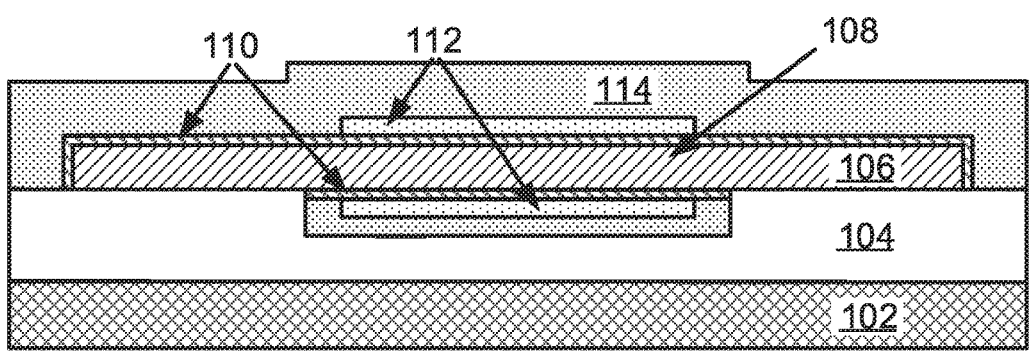
FIG. 8 is cross-sectional view of FIG. 7, showing the semiconductor device covered in the insulating material, in accordance with an embodiment of the present invention.

With reference to FIG. 7, a top-down view of the device 100 is provided showing the formation of insulator material 114, and FIG. 8 is cross-sectional view of the device 100 through line A-A' of FIG. 7.

As shown, the insulator material 114 can be an all-around insulator layer that encapsulates the phase-change material layer 112. The insulator material 114 can include any suitable material in accordance with the embodiments described herein. For example, the insulator material 114 can include, e.g., Si$_3$N$_4$.

In this illustrative embodiment, the insulator material 114 is being used to reattach the suspended nanowire 108 to the substrate 102. However, this reattachment is optional, and can be avoided by, e.g., using a thinner insulator material 114 and/or by increasing the gap height between the suspended nanowire 108 and the substrate 102. Furthermore, an additional filler material (not shown) can be used to reattach the suspended nanowire 108 to the substrate 102 when the insulator material 114 is not thick enough to fill the gap.

Figure 9:
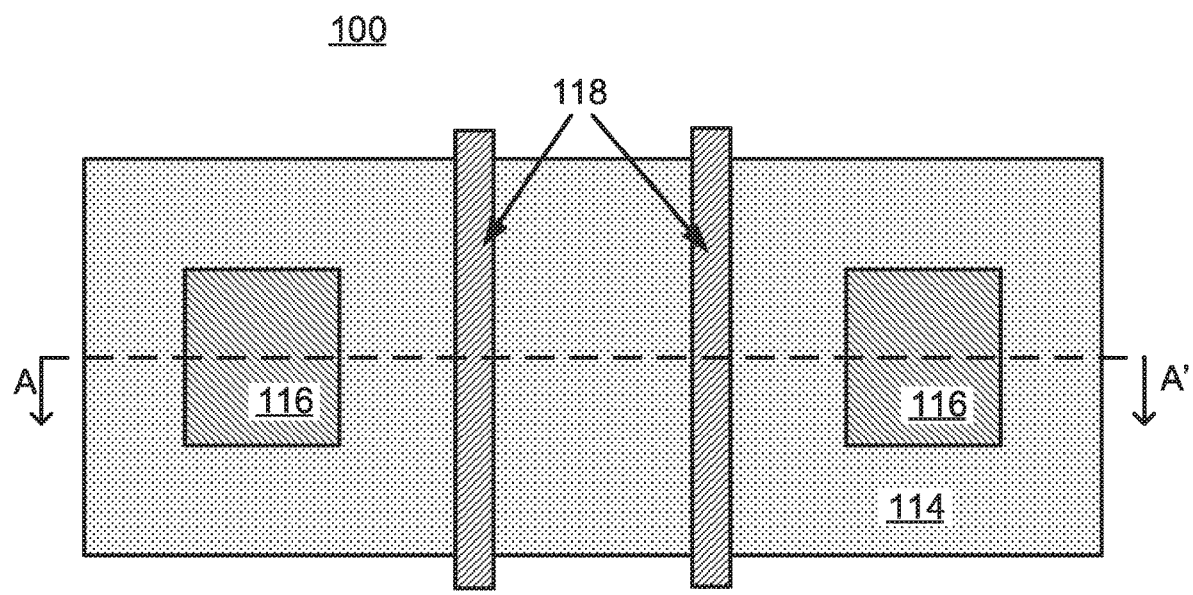
FIG. 9 is a top view showing semiconductor device of FIG. 7 with contacts formed through the insulating material, in accordance with an embodiment of the present invention.
Figure 10:
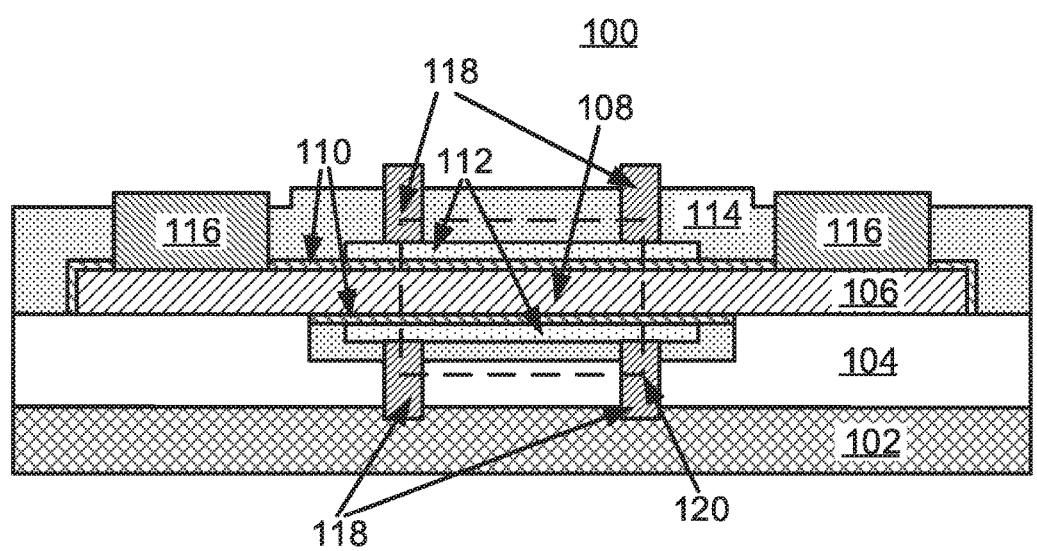
FIG. 10 is cross-sectional view of FIG. 9, showing the contacts formed through the insulating material, in accordance with an embodiment of the present invention.

With reference to FIG. 9, a top-down view of the device 100 is provided showing the formation of contacts, including heater contacts 116 and phase-change material layer contacts 118, and FIG. 10 is a cross-sectional view of the device 100 through line A-A' of FIG. 9.

As shown, the heater contacts 116 are formed through the insulator material 114 and the insulator layer 110 to respective portions of the heater 106 corresponding to the heater contact regions (heater contact regions 107 shown in FIGS. 1 and 2). One of the heater contacts 116 can correspond to a programming pulse contact, and the other of the heater contacts 116 can correspond to a ground contact (GND). Additionally, the phase-change material layer contacts 118 are formed through the insulator material 114 to the phase-change material layer 112. In this illustrative embodiment, the phase-change material layer contacts 118 are all-around contacts. However, in an alternative embodiment, the phase-change material layer contacts 118 can contact only the phase-change material layer 112 from the top.

The contacts 116 and 118 can include any suitable conductive material in accordance with the embodiments described herein. For example, the contacts can be made of a material that does not react with the phase-change material. Examples of suitable materials that can be used to form the contacts 116 and 118 include, but are not limited to, titanium nitride (TiN), tungsten (W), molybdenum (Mo), etc.

As further shown in FIG. 10, a PCM region 120 is depicted. As will be described in further detail below with reference to FIGS. 11-14, the PCM region 120 will be used to describe various states of the device 100 following respective types of Reset and Set pulses.

Figure 11:
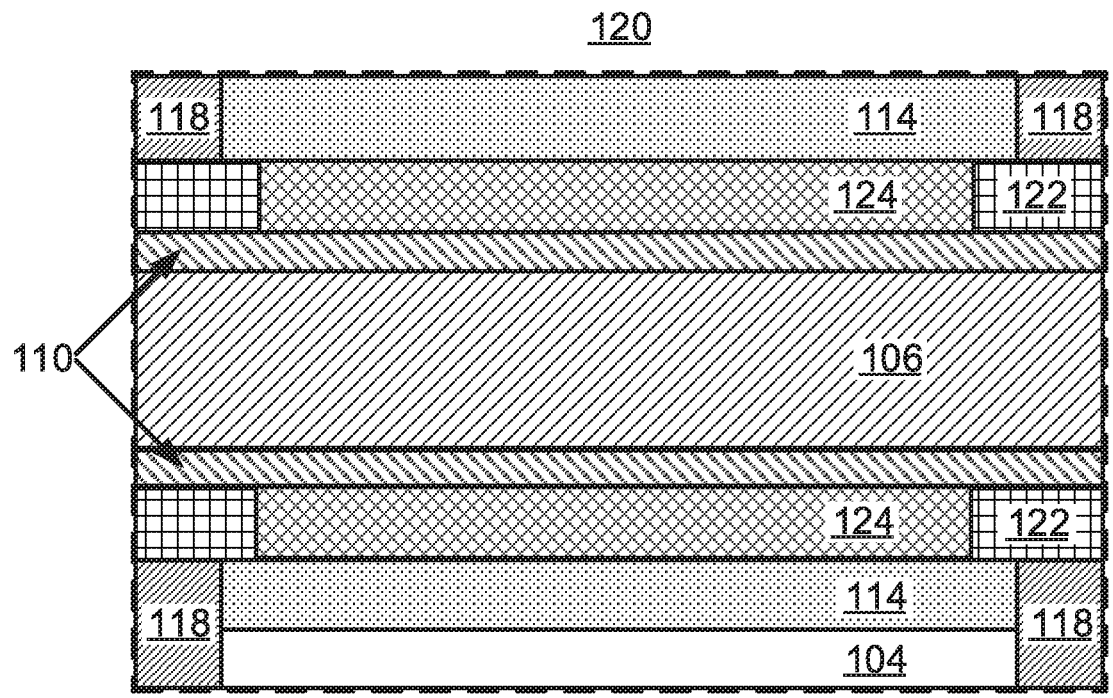
FIG. 11 is cross-sectional view showing the effects of a reset pulse on the device, in accordance with an embodiment of the present invention.

With reference to FIG. 11, the PCM region 120 is shown following a reset pulse. Following the reset pulse, heat is transferred by proximity from the heater 106 to the cladding all-around crystalline phase-change material (c-PCM) 122, and melting and rapid cool-down results in the formation of amorphous phase-change material (a-PCM) 124 within the PCM cladding. The total resistance between the phase-change material layer contacts 118 will increase, as the a-PCM 124, which has poor conductance, is formed in series with the c-PCM 122.

Figure 12:
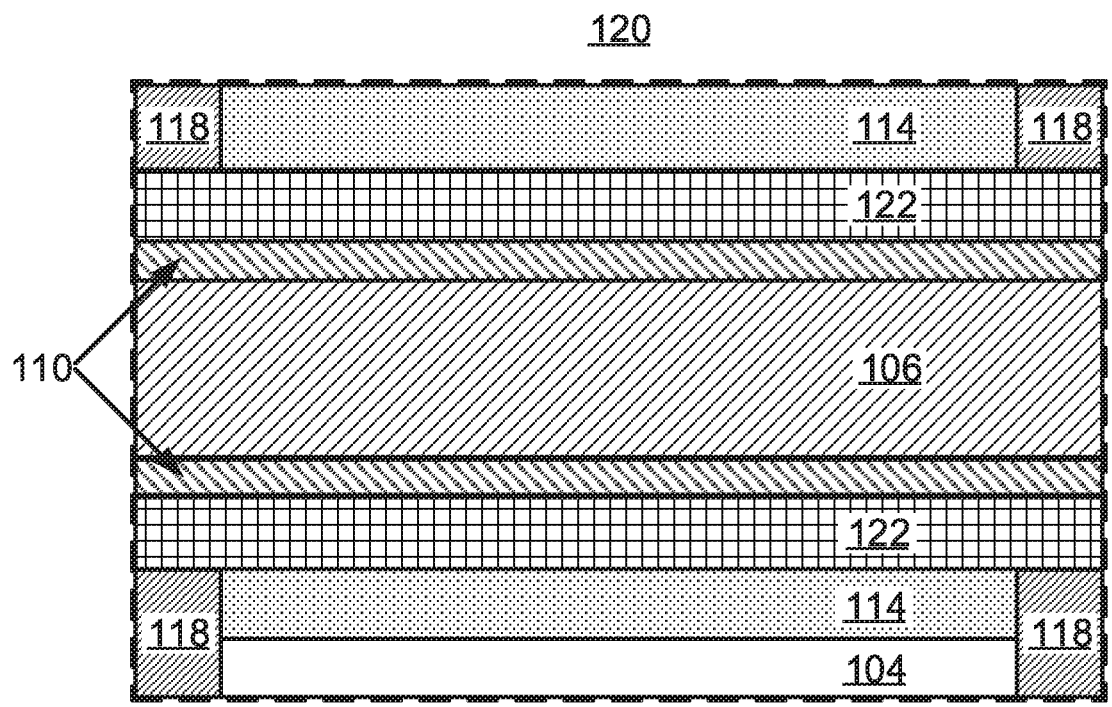
FIG. 12 is cross-sectional view showing the effects of a set pulse on the device, in accordance with an embodiment of the present invention.

With reference to FIG. 12, the PCM region 120 is shown following a set pulse. When the set pulse is applied, heat is transferred from the heater 106 to the PCM cladding, which causes the a-PCM 124 to re-crystallize. The total resistance between the phase-change material layer contacts 118 will be lower since all the PCM cladding is now entirely c-PCM 122.

Figure 13:
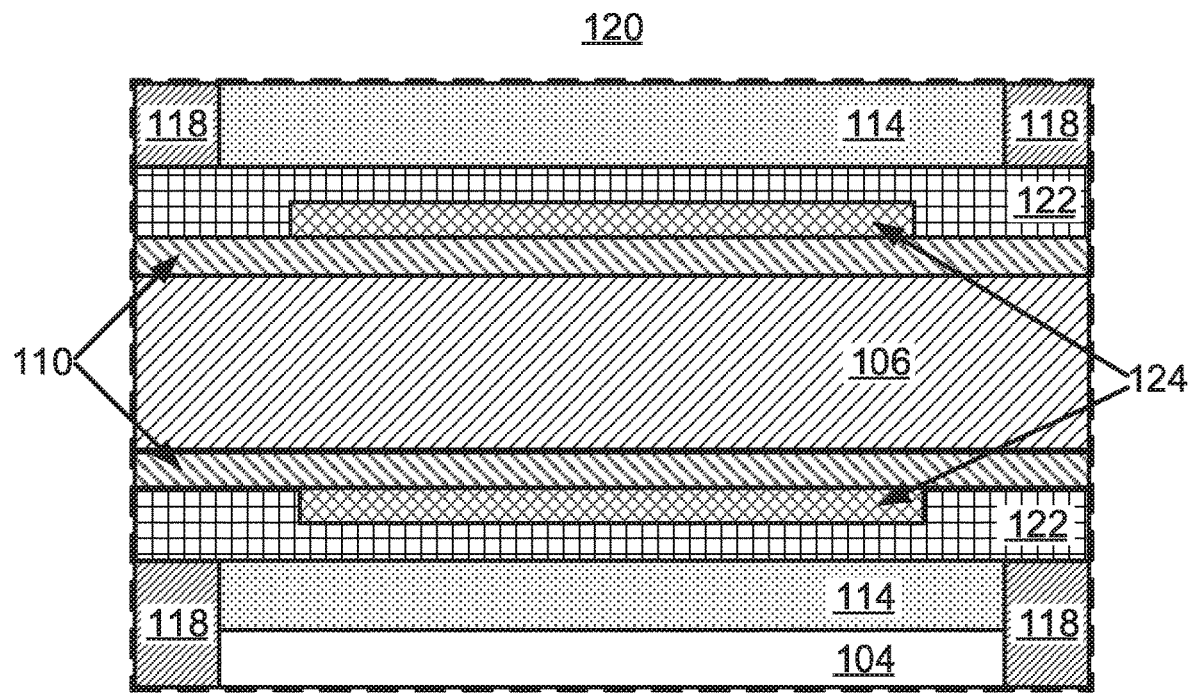
FIG. 13 is cross-sectional view showing the effects of a partial reset pulse on the device, in accordance with an embodiment of the present invention.

With reference to FIG. 13, the PCM region 120 is shown following a partial reset pulse. When a partial reset pulse is applied, only the phase-change material close to the heater 106 melts and is converted into a-PCM 124. As a result, the conduction through the PCM cladding is limited since the remaining c-PCM 122 cladding is thinner, thereby resulting in an intermediate resistance that is higher than a fully-crystalline PCM cladding but lower when compared with a fully-amorphized PCM cladding.

Figure 14:
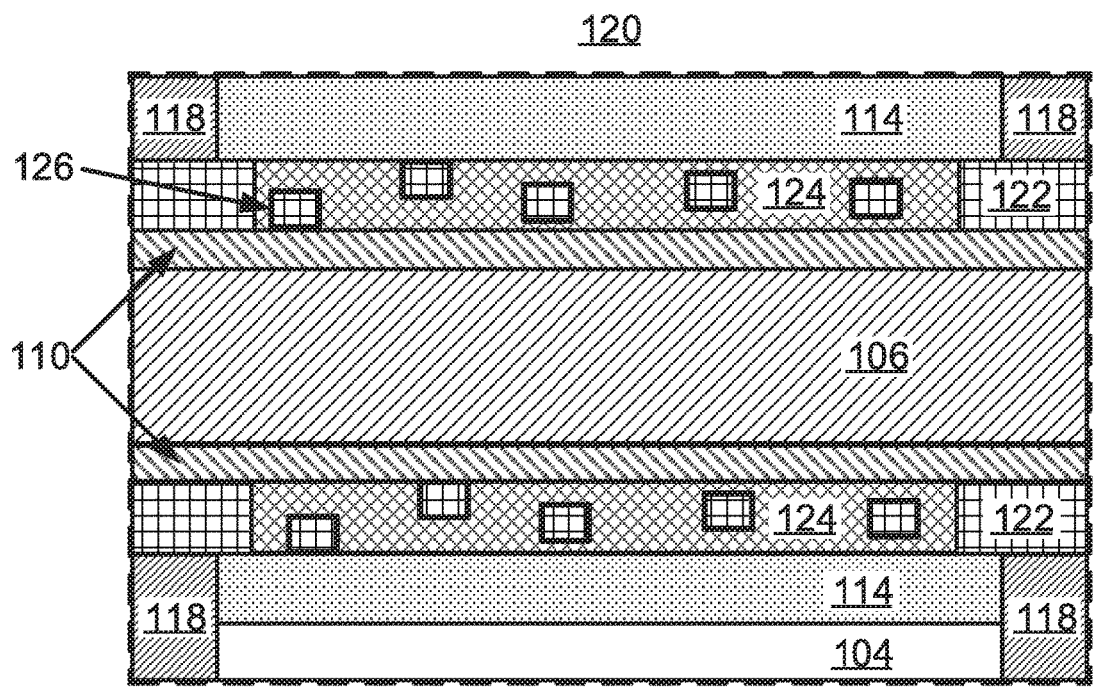
FIG. 14 is cross-sectional view showing the effects of a partial set pulse on the device, in accordance with an embodiment of the present invention.

With reference to FIG. 14, the PCM region 120 is shown following a partial set pulse. When the partial set pulse is applied, the a-PCM 124 is not fully crystallized. Since some regions in the a-PCM 124 nucleate c-PCM crystals 126, the PCM cladding is more conductive when compared with fully-amorphous PCM cladding, thereby leading to an intermediate resistance. Accordingly, setting an intermediate resistance is also possible using the partial set pulse.

Figure 15:
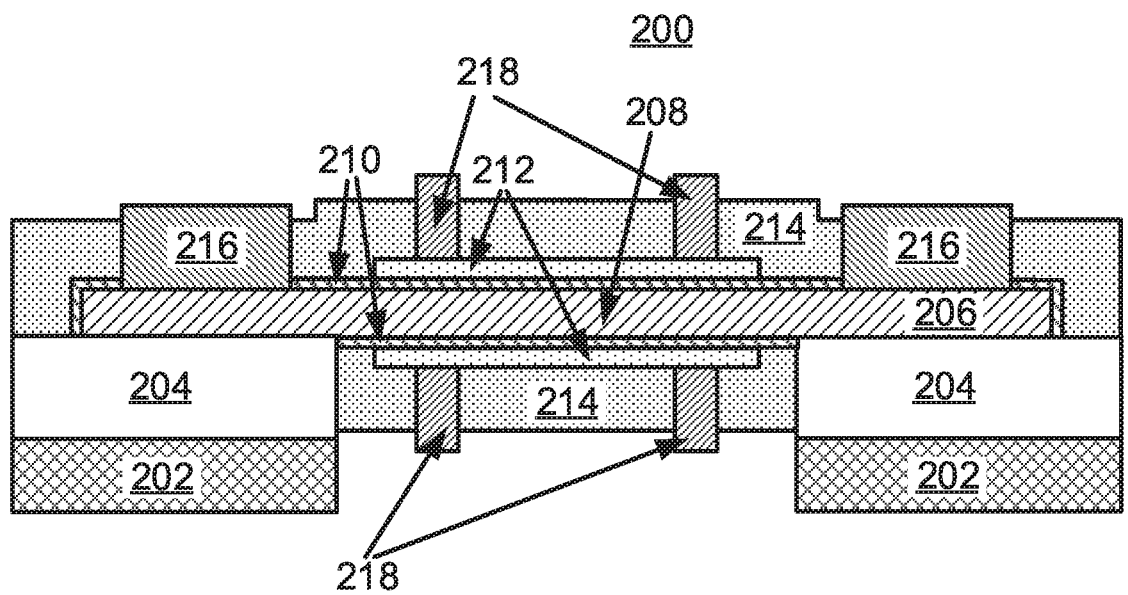
FIG. 15 is cross-sectional view showing a semiconductor device, in accordance with another embodiment of the present invention.

With reference to FIG. 15, a cross-sectional view is provided showing a semiconductor device 200.

The device 200 includes substrate portions 202, insulator portions 204, a nanowire 208 including a heater 206, an insulator layer 210, a phase-change material layer 212, insulator material 214, heater contacts 216, and phase-change material layer contacts 218.

The device 200 is similar to the device 100 described above with reference to FIG. 10 except that, in this illustrative embodiment, the device 200 includes a base structure that includes substrate portions 202 and insulator layer portions 204. That is, in contrast to components 110, 112, 114 and 118 of device 100 which are formed through the base structure of the device 100 described above with reference to FIG. 10, the components 210, 212, 214 and 218 of the device 200 are not formed through a base structure. Instead, the components 210, 212, 214 and 218 are formed between the substrate portions 202 and insulator portions 204, which exposes the lower portions of the insulator layer 214 and the phase-change material contacts 218.

Figure 16:
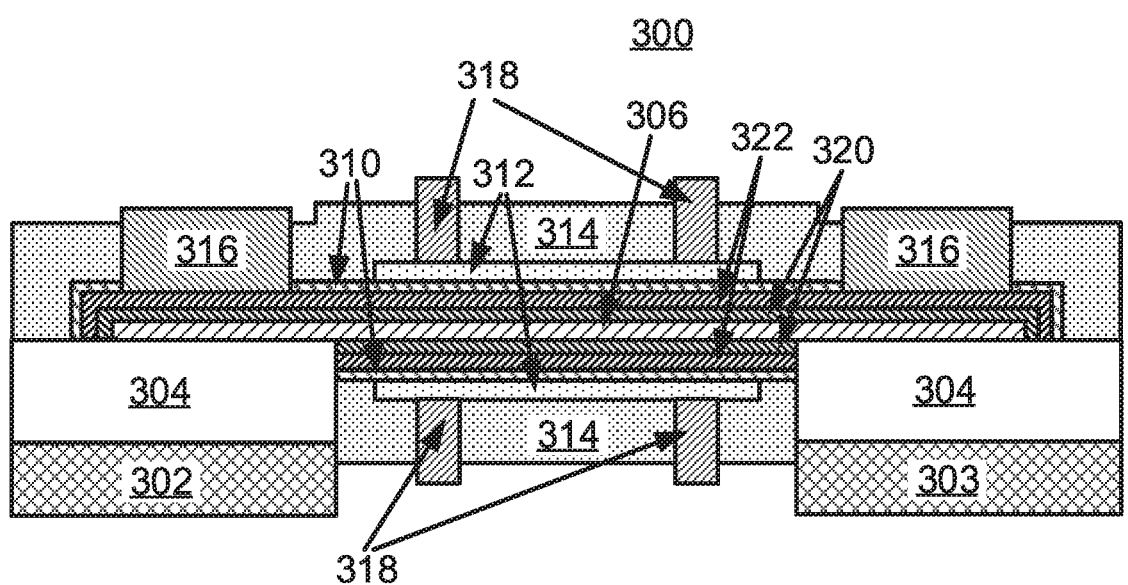
FIG. 16 is cross-sectional view showing a semiconductor device, in accordance with yet another embodiment of the present invention.

With reference to FIG. 16, a cross-sectional view of a semiconductor device 300 is provided. The device 300 is similar to the device 200 except that, in this illustrative embodiment, the semiconductor layer (e.g., nanowire) is a support structure for a heater, instead of being the heater (e.g., in contrast to heater 106 of device 100 described above).

More specifically, the device 300 includes substrate portions 302, insulator layer portions 304, a nanowire 306 corresponding to a heater support structure, an insulator layer 310, a phase-change material layer 312, insulator material 314, heater contacts 316, phase-change material layer contacts 318, an insulator layer 320, and a heater 322.

The nanowire 306 functions as mechanical support for the heater 322. The nanowire 306 is coated with a thin dielectric (or partially oxidized) layer and can be coated all-around with heater material (e.g., resistive metal) of the heater 322. The heater 322 can then be encapsulated by forming a shell of dielectric material (e.g., $Si_3N_4$) corresponding to insulator layer 310.

Although the device 300 is shown having a base structure including substrate portions 302 and insulator layer portions 304, the device 300 can alternatively include a base structure similar to that of device 100 shown in FIG. 10. More specifically, the device 300 could alternatively include a base structure including a continuous substrate and insulator layer.

Figure 17:
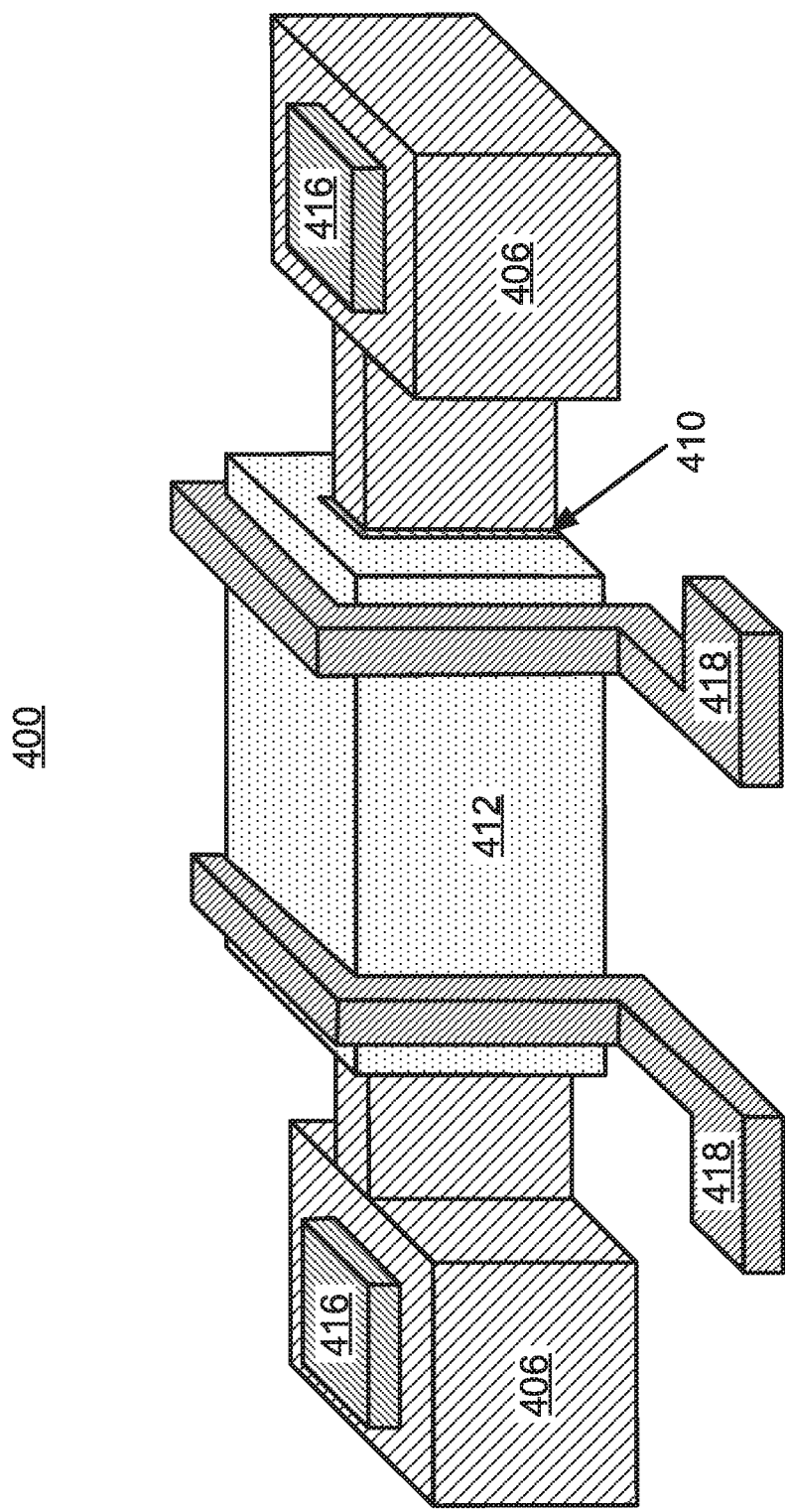
FIG. 17 is perspective view showing a semiconductor device having a PCM over a fin, in accordance with an embodiment of the present invention.

With reference to FIG. 17, a perspective view is provided showing a semiconductor device 400 including a PCM device. For example, the device 400 can show a perspective view of the device 100 described above with reference to FIGS. 1-14.

As shown, the device 400 includes a heater 406. As shown, the heater 406 can be built as a fin. The device can further include a phase-change material layer 412. The phase-change material layer 412 can illustratively include c-PCM material. An insulator layer 410 (e.g. thin insulator layer) can be inserted between the heater 406 and the phase-change material layer 412. The device 400 can further include heater contacts 416 and phase-change material layer contacts 418. One of the heater contacts 416 can correspond to a programming pulse applying a set/reset/partial set/partial reset pulse to the device 400, as described above with reference to FIGS. 11-14, while the other one of the heater contacts 416 can correspond to GND. The phase-change material layer contacts 418 can be used to provide resistance readout for the device 100.

Figure 18:
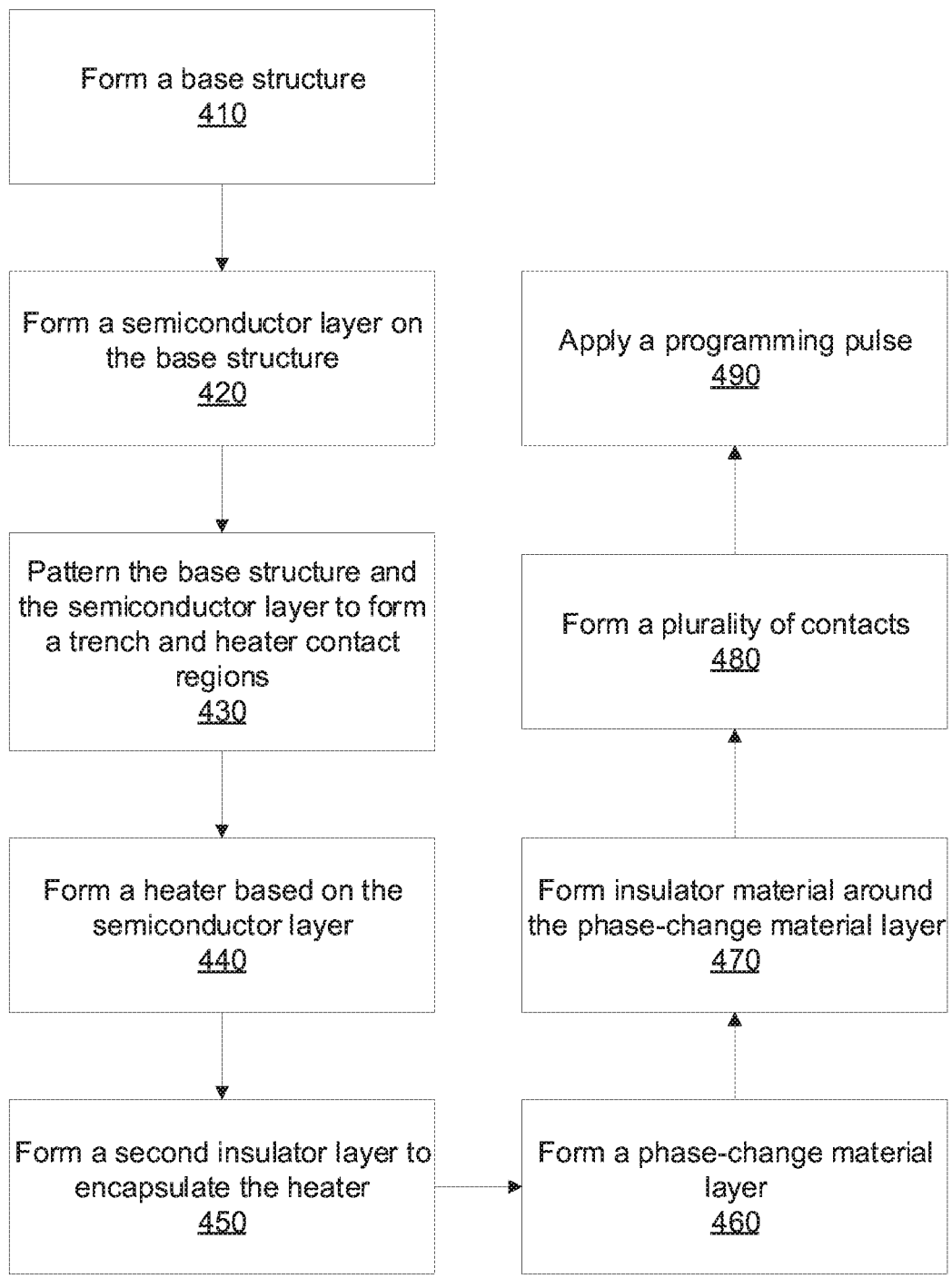
FIG. 18 is a block/flow diagram showing a method for forming a semiconductor device, in accordance with an embodiment of the present invention.

With reference to FIG. 18, a block/flow diagram is provided illustrating a system/method for fabricating a semiconductor device. The semiconductor device can include a memory device (e.g., PCM device) having separate programming and resistance readout control. For example, the memory device can include a four-terminal PCM device.

At block 410, a base structure is formed. The base structure can include a substrate and a first insulator layer. Any suitable process can be used to form the base structure in accordance with the embodiments described herein.

At block 420, a semiconductor layer is formed on the base structure. The semiconductor layer can include, e.g., a nanowire. Any suitable process can be used to form the semiconductor layer in accordance with the embodiments described herein.

At block 430, the base structure and the semiconductor layer are patterned to form a trench and heater contact regions. The trench can be formed within the first insulator layer, and the heater contact regions can correspond to another portion of the semiconductor layer. Any suitable process can be used to form the trench and heater contact regions in accordance with the embodiments described herein.

Further details regarding blocks 410-430 are described above with reference to FIGS. 1, 2 and 15-17.

At block 440, a heater can be formed based on the semiconductor layer. Any suitable process can be used to form the heater layer in accordance with the embodiments described herein. For example, in one embodiment, forming the heater can include converting the semiconductor layer (e.g., nanowire) into the heater using an anneal process. For example, the semiconductor layer can be converted into a metal silicide (e.g., $NiSi_2$) using any suitable process in accordance with the embodiments described herein. In another embodiment, instead of converting the semiconductor layer (e.g., nanowire) into a heater, the semiconductor layer (e.g., nanowire) can serve as a mechanical support structure for a heater formed around the semiconductor layer.

At block 450, a second insulator layer can be formed to encapsulate the heater. The second insulator layer can include a thin dielectric layer. Any suitable process can be used to form the second insulator layer in accordance with the embodiments described herein.

Further details regarding blocks 440 and 450 are described above with reference to FIGS. 3, 4 and 15-17.

At block 460, a phase-change material layer is formed. Forming the phase-change material layer can include depositing phase-change material, and removing portions of the phase-change material from the heater contact regions. Further details regarding block 460 are described above with reference to FIGS. 5, 6 and 15-17.

At block 470, insulator material can be formed around the phase-change material layer. The insulator material can include any suitable material in accordance with the embodiments described herein. Further details regarding block 470 are described above with reference to FIGS. 7, 8 and 15-17.

At block 480, a plurality of contacts are formed. Forming the plurality of contacts can include forming first contacts to the heater for programming, and forming second contacts electrically isolated from the first contacts to the phase-change material layer for resistance readout. More specifically, the first contacts can be formed through the insulator material to the heater contact regions, and the second contacts can be formed through the insulator material to the phase-change material layer. The first contacts can include a programming pulse contact and a ground contact. Further details regarding block 480 are described above with reference to FIGS. 9, 10 and 15-17.

At block 490, a programming pulse can be applied. The programming pulse can be, e.g., a reset pulse, a partial reset pulse, a set pulse, or a partial set pulse. Further details regarding block 490 are described above with reference to FIGS. 11-14.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for fabricating a semiconductor device, comprising:
   forming first contacts to a heater for programming, wherein the heater is disposed on a base structure including a substrate and a first insulator layer and a semiconductor layer is formed on the base structure; and
   forming second contacts to a phase-change material layer for resistance readout, the phase-change material layer being formed in proximity to the heater, and the first contacts being electrically isolated from the second contacts to provide separate programming and resistance readout control.

2. The method of claim 1, further comprising:
   forming the heater based on the semiconductor layer.

3. The method of claim 2, wherein forming the heater further includes converting the semiconductor layer into the heater using an anneal process.

4. The method of claim 1, further comprising forming a semiconductor layer as a mechanical support for the heater, wherein the heater is formed around the semiconductor layer.

5. The method of claim 1, further comprising forming a second insulator layer to encapsulate the heater.

6. The method of claim 5, further comprising forming the phase-change material layer, including depositing phase-change material and removing portions of the phase-change material from heater contact regions of the heater.

7. The method of claim 6, further comprising forming insulator material around the phase-change material layer, wherein the first contacts are formed through the insulator material to the heater contact regions and the second contacts are formed through the insulator material to the phase-change material layer.

8. The method of claim 1, further comprising applying a programming pulse selected from the group consisting of: reset pulse, partial reset pulse, set pulse and partial set pulse.

9. A method for fabricating a semiconductor device, comprising:
   forming a semiconductor layer on a base structure including a substrate and an insulator layer;
   forming a heater based on the semiconductor layer;
   forming a phase-change material layer in proximity to the heater;
   forming insulator material around the phase-change material layer;
   forming first contacts through the insulator material to heater contact regions of the heater for programming; and
   forming second contacts through the insulator material to a phase-change material layer for resistance readout, the first contacts being electrically isolated from the second contacts to provide separate programming and resistance readout control.

10. The method of claim 9, wherein forming the heater further includes converting the semiconductor layer into the heater using an anneal process.

11. The method of claim 9, wherein the semiconductor layer is a mechanical support for the heater, and wherein the heater is formed around the semiconductor layer.

12. The method of claim 9, further comprising forming a second insulator layer to encapsulate the heater.

13. The method of claim 9, wherein forming the phase-change material layer further includes depositing phase-change material over the insulator layer and removing portions of the phase-change material from the heater contact regions.

14. The method of claim 9, further comprising applying a programming pulse selected from the group consisting of: reset pulse, partial reset pulse, set pulse and partial set pulse.

15. A semiconductor device, comprising:
   a heater disposed on a base structure including a substrate and a first insulator layer;
   a phase-change material layer located in proximity to the heater;
   an insulator material disposed around the phase-change material layer;
   first contacts formed through the insulator material and disposed on heater contact regions of the heater for programming; and
   second contacts formed through the insulator material and disposed on the phase-change material layer for resistance readout, the first contacts being electrically isolated from the second contacts to provide separate programming and resistance readout control.

16. The device of claim 15, further comprising a second insulator layer encapsulating the heater.

17. The device of claim 15, wherein the phase-change material layer is wrapped around the heater.

18. The device of claim 15, wherein the heater includes a metal silicide.

19. The device of claim 15, further comprising a semiconductor layer as a mechanical support for the heater, wherein the heater is formed around the semiconductor layer.

* * * * *